United States Patent
Guerineau et al.

(10) Patent No.: US 7,330,266 B2
(45) Date of Patent: Feb. 12, 2008

(54) STATIONARY FOURIER TRANSFORM SPECTROMETER

(75) Inventors: Nicolas Guerineau, Antony (FR); Joël Deschamps, Marcoussis (FR); Sylvain Rommeluere, Meudon (FR)

(73) Assignee: Onera, Chatillon (FR)

( * ) Notice: Subject to any disclaimer, the term of this patent is extended or adjusted under 35 U.S.C. 154(b) by 336 days.

(21) Appl. No.: 10/854,428

(22) Filed: May 27, 2004

(65) Prior Publication Data

US 2004/0239939 A1    Dec. 2, 2004

(30) Foreign Application Priority Data

May 28, 2003 (FR) ................................. 03 06548

(51) Int. Cl.
*G01B 9/02* (2006.01)
*G01J 3/45* (2006.01)

(52) U.S. Cl. ...................... 356/454; 356/519

(58) Field of Classification Search ............... 356/454, 356/519, 480; 250/339.07, 339.08, 227.27
See application file for complete search history.

(56) References Cited

U.S. PATENT DOCUMENTS 4,822,998 A  4/1989  Yokota et al.

6,016,199 A  1/2000  Newton

OTHER PUBLICATIONS

Juntila et al., "Performance limits of stationary Fourier spectrometers," *J. Opt. Soc. Am. A*, Sep. 1991, pp. 1457-1462, vol. 8, No. 9.

Manzardo et al., "Miniaturized time-scanning Fourier transform spectrometer based on silicon technology," *Optics Letters*, Dec. 1, 1999, pp. 1705-1707, vol. 24, No. 23.

Voge et al., "Simple infrared Fourier transform spectrometer adapted to low light level and high-speed," *Optical Engineering*, Sep. 1998, pp. 2459-2466, vol. 37, No. 9.

*Primary Examiner*—Patrick Connolly
(74) *Attorney, Agent, or Firm*—Lowe Hauptman Ham & Berner LLP

(57) ABSTRACT

The invention aims to integrate a two-wave stationary interferometer on a photodetector during fabrication in order to constitute a miniature stationary Fourier transform spectrometer. The interferometer essentially comprises a plate having a first plane face coinciding with an image plane on semiconductor photosensitive elements and a second face that is not parallel to the first face. The second face reflects a wave that has a phase difference relative to the incident wave interfering with it that is a function of the local thickness of the plate.

16 Claims, 3 Drawing Sheets

STATIONARY FOURIER TRANSFORM SPECTROMETER

CROSS-REFERENCE TO RELATED APPLICATION

The application claims priority under 35 U.S.C. §119 based on French Application No. 0306548, filed May 28, 2003, the entire disclosure of which is hereby incorporated by reference.

BACKGROUND OF THE INVENTION

1. Field of the Invention

The present invention relates to detecting and quantitatively analyzing the spectral content of a light wave. It concerns more particularly a stationary Fourier transform spectrometer including a photodetector with semiconductor elements responsive particularly to incident radiation and a two-wave stationary interferometer comprising a semi-reflecting diopter.

2. Description of the Prior Art

A Michelson interferometer comprising a wave splitter and two mirrors, for example, imposes an optical path difference between two majority waves by positioning one of the mirrors relative to the other in translation or rotation. The intensity of the wave resulting from the phase difference of the two majority waves reflected by the mirrors varies as a function of the displacement of the mirror and forms an interferogram on the detector. The interferogram represents the variation of the luminous intensity received by the detector as a function of the phase difference which enables deduction of the spectral intensity as a function of frequency after sampling and using a Fourier transform.

The photodetector is useful for detecting and quantitatively analyzing the spectral content of a light wave. The analysis contributes to the definition of the emission and reflection optical properties of a source of radiation, such as an observed scene, and of the propagation medium between that source and the photodetector. Carrying out the measurement at different times identifies the physical phenomena involved in the emission and propagation of the radiation and how they evolve over time. If the photodetector is coupled to an imaging system (imager), each point of the observed scene and the spectral signature thereof are associated and therefore perform simultaneous imaging and spectrometry.

Prior art stationary Fourier transform spectrometers are described in the paper "Performance limits of stationary Fourier spectrometers", M. -L. Junttila et al., Journal of Optical Society of America, Vol. 8, No 9, September 1991, p. 1457-1462, and have proven advantages in terms of resolution, spectral bandwidth, radiometric sensitivity and acquisition rate. A Michelson interferometer with a semi-reflecting beam splitter and two mirrors, or a modified Mach-Zehnder interferometer with a semi-reflecting beam splitter and three mirrors, or a triangular interferometer with a semi-reflecting beam splitter and two facing mirrors splits an incident light wave into two reflected waves having a phase difference and optical path differences that generate an interferogram on the observation plane consisting of the photosensitive face of the detector. The interferogram reproduced in the observation plane is sampled by a linear or matrix set of individual photosensitive elements.

The analysis spectral range of spectrometers of this type is delimited by wavelengths $\lambda_{min}$ and $\lambda_{max}$. The lower limit $\lambda_{min}$ is linked to the sampling step $d\delta$ of the interferogram by the following formula:

$$\lambda_{min}=2d\delta$$

In practice, the upper limit is defined by the sensitivity of the detector, which is blind beyond the value $\lambda_{max}$.

The spectral resolution $d\lambda$ of the spectrometer for the analysis of a light wave of wavelength $\lambda$ is related to the maximum optical path difference $\delta_{max}$ created by the interferometer between the two waves by the following formula:

$$d\lambda=\lambda^2/(2\delta_{max})$$

Such spectrometers offer high performance in theory, but are subject to practical implementation limitations, related in particular to the opto-mechanical adjustment of the interferometer. The interferometer proves complicated to adjust, in particular in radiation bands where the monitoring means are not visual. In the case of infrared spectrometry of scenes with a low luminous flux, it is necessary to cool the whole of the spectrometer to reduce heat contributions related to the spectrometer. These practical constraints intrinsic to the spectrometer, added to the external constraints linked to experimental, on-board or field conditions, lead to the production of spectrometer prototypes that are costly, fragile and bulky.

On the other hand, the linear or matrix detectors used in this type of spectrometer have benefited over the last decade from considerable technological advances that have culminated in the mass production of photosensitive strips and matrices comprising a large number of individual detectors of high performance.

To reduce the drawbacks of previous spectrometers caused by their interferometers, Omar Manzardo et al., according to their paper "Miniaturized time-scanning Fourier transform spectrometer based on silicon technology", Optics Letters, Vol. 24, No 23, December 1999, p. 1705-1707, have sought to miniaturize an interferometer with a splitter and two mirrors to yield a microsystem having dimensions compatible with integrated circuit formats. One of the mirrors is moved linearly by an electrostatic comb actuator. This technology necessitates additional technology steps to design and produce the microsystem, which must then be coupled to a matrix of photosensitive elements of a detector.

OBJECT OF THE INVENTION

The object of the present invention is to integrate a two-wave stationary interferometer function into a photodetector during fabrication in order to constitute a miniature stationary Fourier transform spectrometer operating in the infrared in particular.

SUMMARY OF THE INVENTION

Accordingly, a stationary Fourier transform spectrometer comprises a semi-reflecting diopter and semiconductor photosensitive elements having active faces coinciding with an image plane. The spectrometer is characterized in that it comprises a plate having a first plane face coinciding with the image plane on the photosensitive elements, and a second face that is not parallel to the first face and carries the semi-reflecting diopter in order for the thickness between the faces of the plate, which is substantially constant in front of each photosensitive element, to vary regularly from one photosensitive element to another.

According to the invention, the first plane face of the plate constituting the interferometer coincides with the image plane and therefore coincides with the active faces of the photosensitive elements of the detector, with no intermediate diopter; consequently, the plate interferometer is completely integrated into the detector, and the interferometer and the detector are not two physically separable components of which one is attached to the other by any fixing techniques, such as adhesive bonding.

So, the thickness variation between the faces of the plate induces a linear optical path difference variation δ between a minimum value $\delta_{min}$ close to zero and a maximum value $\delta_{max}$ with a sampling step dδ.

The spectrometer of the invention comprises an interferometer essentially consisting of the plate and having a wave splitter consisting of the first plane face coinciding with the faces of the active region of the detector and a single mirror consisting of the non-parallel second face, which is of the semi-reflecting type. The active region of the detector comprises a set of photosensitive elements.

Each photosensitive element of the detector constitutes an individual picture element, called as a pixel, that faces a region of the plate. This region constitutes an elementary interferometer of the two majority wave type. The phase difference between the two waves is directly related to the thickness of the plate in this region.

Thanks to the variation in the thickness of the plate from one region to the other, and therefore of the phase difference parameter variation from one pixel to the other, a stationary Fourier transform spectrometer is obtained. The relative location on the detection plane of a region inducing a optical path difference δ with a region inducing a optical path difference δ+dδ or δ−dδ may take any value. The spectrometer of the invention is therefore very compact, since the image plane coincides both with the first face of the plate and the active faces of the photosensitive elements, and thus integrates against the detector a two-wave interferometer benefiting from both modern detector fabrication technologies and the intrinsic performance capabilities of stationary Fourier transform spectrometers.

The invention relates a method of fabricating a stationary Fourier transform spectrometer comprising a semi-reflecting diopter and semiconductor photosensitive elements having active faces coinciding with an image plane, which method comprises the steps of:

forming the photosensitive elements with their active faces on a first face of a substrate coinciding with the image plane, thinning the substrate into a plate having a second face that is not parallel to the first face in order for the thickness between the faces of the plate to vary from one photosensitive element to the other, and depositing on the second face a semi-reflecting layer forming the semi-reflecting diopter.

Preferably, the method comprises integrating a read circuit against the photosensitive elements by means of a hybridation technique after the forming step.

BRIEF DESCRIPTION OF THE DRAWINGS

Other features and advantages of the present invention will become more clearly apparent on reading the following description of preferred embodiments of the invention, given with reference to the corresponding appended drawings, in which.

DESCRIPTION OF THE PREFERRED EMBODIMENTS

Figure 1:
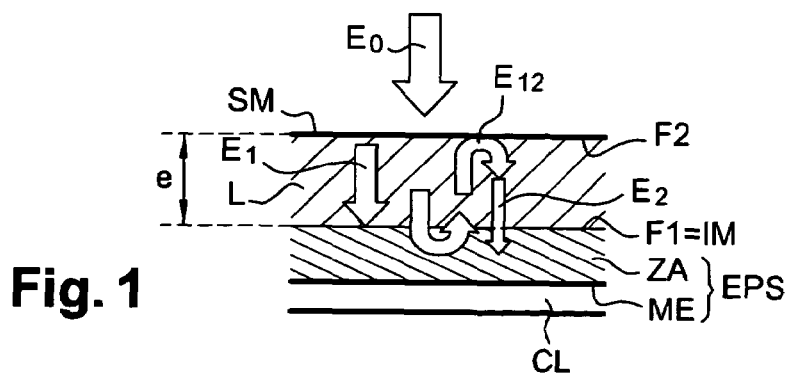
FIG. 1 is a view in section of a photosensitive element facing a region of the plate with parallel faces in a miniature spectrometer of an embodiment of the invention.

With reference to FIG. 1, a photosensitive element EPS with a semiconductor heterostructure in a detector is shown. The element EPS relates to a detected picture element, called a pixel. It has a sensitive face constituting an image plane IM over a photosensitive active region ZA that absorbs the greater part of an incident wave E1. The other face of the element EPS integrates a read circuit CL including electrode and separated by an insulative layer from the active region ZA. The active region ZA and the read circuit CL are combined using a hybridation technique.

A plate L made of a material substantially transparent to the incident radiation is superposed on the photosensitive element EPS. For example, the plate L is made from a crystalline compound including a semiconductor, for example a telluride compound such as cadmium and zinc telluride Cd Zn Te having a refractive index n=2.7. The thickness e of the plate is from a few micrometers to a few tens of micrometers. A first face F1 of the plate L coincides with the image plane IM and therefore with the photosensitive face of the element EPS. A second face F2 of the plate L coincident with the propagation medium/plate diopter is covered with one or more thin dielectric or metallic layers SM that causes the propagation medium/plate diopter to be semi-reflecting in the analysis spectral band. The first face F1 and the second face F2 respectively correspond to a "front" face and a "rear" face of a substrate made from the material that is substantially transparent at the beginning of fabrication of the spectrometer of the invention, before turning over and machining the substrate, as will be explained later.

When an incident wave E0 at normal incidence impacts on the pixel of the spectrometer, a large portion E1 of the wave E0 passes through the semi-reflecting face F2 of the plate L. Inside the plate, the incident wave E1 is split by the plate/active region F1 diopter into a majority portion absorbed by the active region ZA of the element EPS and a minority portion E12 reflected toward the semi-reflecting face F2. The wave portion E12 is in turn partly reflected in the plate L by the semi-reflecting face F2, yielding a reflected wave E2 containing approximately 5 to 10% of the energy of the internal incident wave E1. The waves E1 and E2 constitute two majority waves, other splitting and reflection effects of higher than the first order being negligible.

The majority waves E1 and E2 interfere on the image plane IM and produce on the photosensitive face F1 of a row or a matrix of photosensitive elements EPS in the detector an interferogram that is transmitted by the read circuit CL to electrical spectral analysis means known in the art (not shown).

The wave E2 travels an additional optical path difference δ relative to the wave E1, given by the following equation:

$$\delta = 2ne$$

In a spectrometer SP of an embodiment of the invention, the thickness e of the plate LC (FIGS. 2 and 3) or plate LM (FIG. 4) varies from one element to the other, for example in one direction, i.e. along the row of photosensitive elements of a linear detector or along each of the parallel rows, lines or columns, of photosensitive elements of a matrix detector. A stationary interferometer results over the whole of the surface of the detector on which the interferogram has contrasted fringes, which facilitates sampling of the interferogram by the spectral analysis means.

Figure 2:
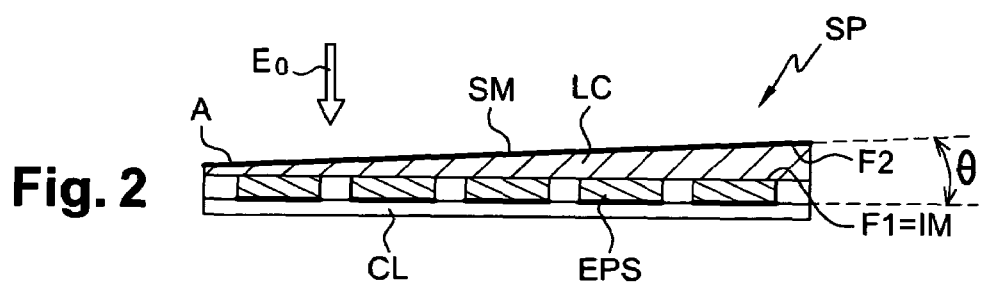
FIG. 2 is a diagrammatic view in section of a spectrometer of the invention with a wedge-shaped plate with plane faces.

In FIG. 2 there is shown a row of a few photosensitive elements EPS over which the plate LC has a plane semi-reflecting face F2 that is not parallel to the image plane face F1. In practice, a row, such as a line or column, comprises more than around one hundred photosensitive elements.

The plate LC is wedge-shaped, i.e. has the shape of a dihedron having half-planes coplanar with the faces F1 and F2 and an angle .theta. of a few tens of milliradians. The thickness between the faces F1 and F2 of the plate is substantially constant in the region facing a photosensitive element EPS, in the sense that the effects of the variations in local thickness related to tan (.theta.) are neglected over this region.

The edge A of the dihedron is substantially perpendicular to each row of photosensitive elements. The row of photosensitive elements EPS is therefore exposed to incident illumination E0 that comprises a sinusoidal modulation of period λ/n if it is illuminated with a monochromatic wave of wavelength λ. With polychromatic illumination, the spatial distribution of illumination along the row of pixels is then written as an incoherent superposition of sinusoids with different periods. This amounts to a "conventional" interferogram, i.e. one of the type generated by a two-wave interferometer used in a conventional Fourier transform spectrometer. However, in the interferometer of the invention consisting of the wedge-shaped plate LC, the first majority wave E1 interferes with no reflection at a mirror with the second majority wave E2 that is reflected by a single mirror consisting of the plane semi-reflecting face F2. Thus the interferometer of the invention comprises only one wave splitter F1 and one mirror F2.

The geometry of the variable thickness plate LC is obtained by thinning a substrate made from the material of the plate during the production of the spectrometer of the invention as described hereinafter.

Figure 3:
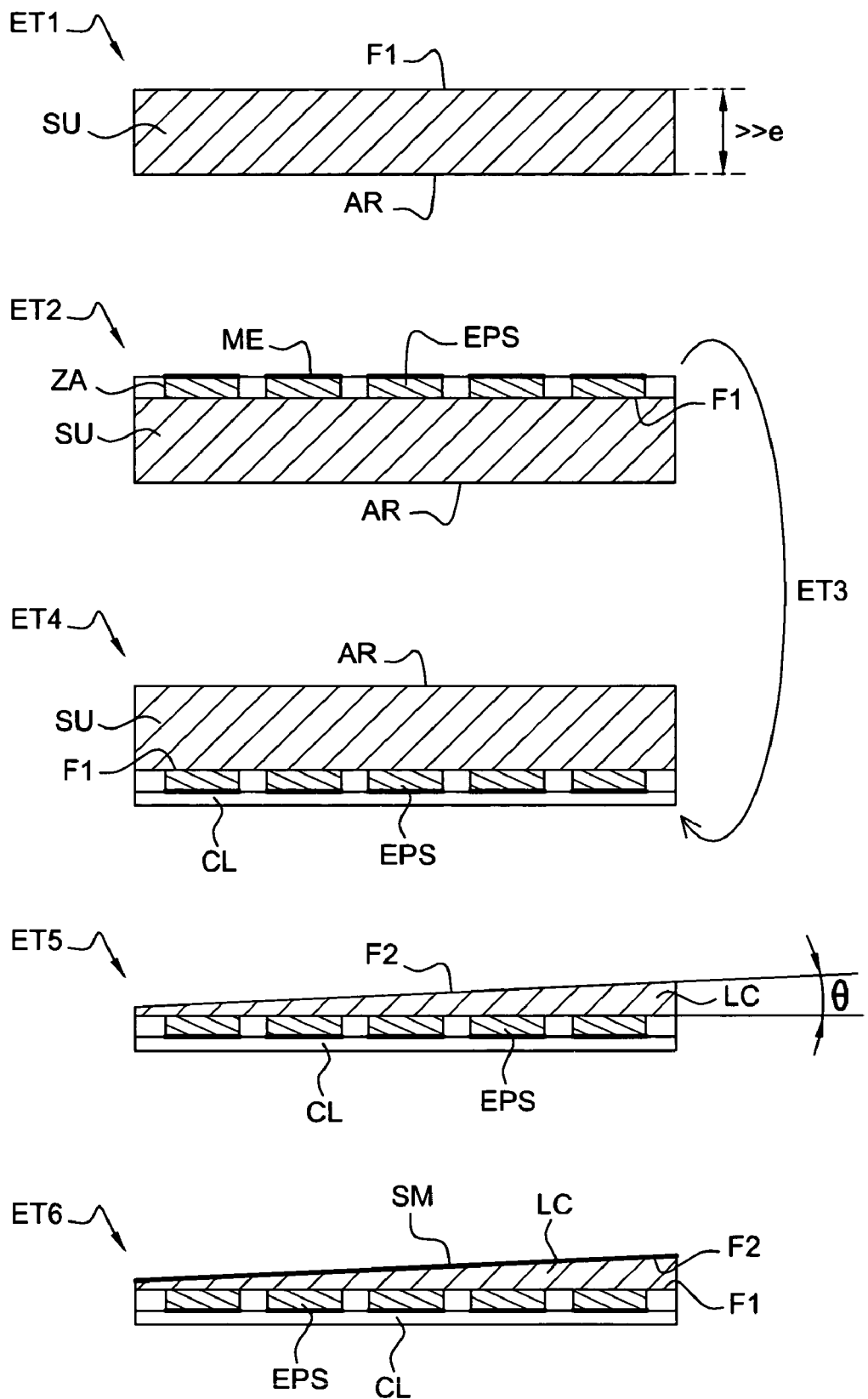
FIG. 3 is an illustrator of steps of a method of fabricating the spectrometer shown in FIG. 2.

The fabrication of a spectrometer of the invention, for example a matrix spectrometer, comprises the main steps ET1 to ET6 depicted in FIG. 3. The steps ET1 to ET6 are known separately to the person skilled in the art but together constitute a novel combination that is characteristic of the fabrication method.

The initial step ET1 uses a substantially transparent substrate SU, for example made of Cd Zn Te, having a refractive index n=2.7, and much thicker than the plate LC, i.e. having a thickness of approximately 500 μm. There is then grown on the "front" face F1 of the substrate a photo-absorbent active region ZA having a heterostructure with different semiconductor and insulative layers forming the matrix of photosensitive elements EPS. The region ZA is grown to a thickness from approximately 7 μm to 10 μm on the "front" face of the substrate, using a molecular beam epitaxy or vapor phase deposition process, in the step ET2. A metallization layer ME combined with an insulative layer in deposited and etched on the active region to form the electrodes of each element EPS.

The substrate SU carrying the active region ZA is then turned over in the step ET3. The face of the substrate that was originally the front face receives the read circuit CL on the metallization layer ME that lies against the photosensitive elements EPS, an integration technique being used in the step ET4 to yield a hybrid circuit ZA+CL. The read circuit may comprise shift registers for lines and/or columns of photosensitive elements. Alternatively, the integration step ET4 precedes the turning over step ET3.

The "rear" face AR of the substrate SU, now on top, is abraded mechanically or etched chemically by ionic erosion in the step ET5. This considerably thins the transparent material substrate to produce a plate whose face F2 is not parallel to the "front" face of the substrate. For example, this method may thin the substrate to yield a wedge-shaped plate LC whose thickness varies from approximately 1 to 2 μm to approximately 10 μm and whose dihedral angle Θ is a few milliradians, typically 8 to 12 milliradians.

The plane face F2 of the plate LC, which has not been subjected to any anti-reflection treatment, finally receives in the step ET6 a deposit consisting of a plurality of stacked thin dielectric layers forming a semi-reflecting layer SM. By increasing the intensity of the reflected second majority wave E2, this increases the contrast of the fringes of the interferograms to be detected.

Numerous topographies for the plate thickness for a spectrometer having a linear detector or a matrix detector comprising M×N photosensitive elements fall within the scope of the invention.

Figure 4:
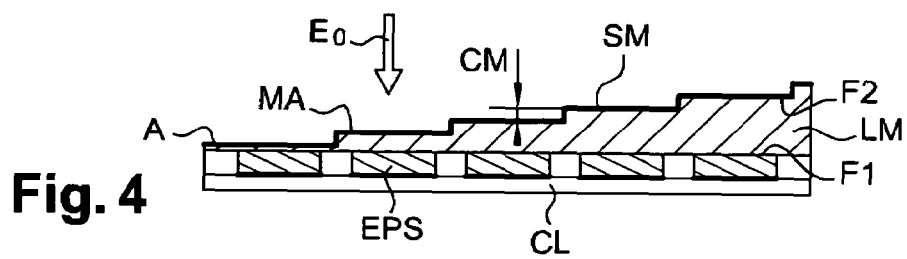
FIG. 4 is a diagrammatic view in section in a plane perpendicular to the first plane face of a spectrometer of the invention with a plate having a face in the shape of a staircase.

In a second embodiment of the invention, shown in FIG. 4, stepwise thinning avoids local thickness variations within each element. Each step MA is substantially as wide as at least one photosensitive element, as shown in FIG. 1, or alternatively a few photosensitive elements EPS of a row or a column. The second face F2 of the plate LM whose profile is in the shape of a staircase further accentuates the contrast of the fringes for the analysis of wavelengths close to $\lambda_{min}$ by preventing spatial pixel filtering effects. The height of the riser CM between two consecutive steps is then made substantially equal to $\lambda_{min}/4n$, i.e. to the sampling step dδ defined above.

All the photosensitive elements of the same line or the same column of the matrix are under the same thickness of the plate LM. This yields the possibility of averaging the responses of identical photosensitive elements EPS in the direction of the line or column of constant thickness to increase the signal to noise ratio in the case of low luminous flux spectrometry. This direction may also be used for imaging in one direction.

Figure 5:
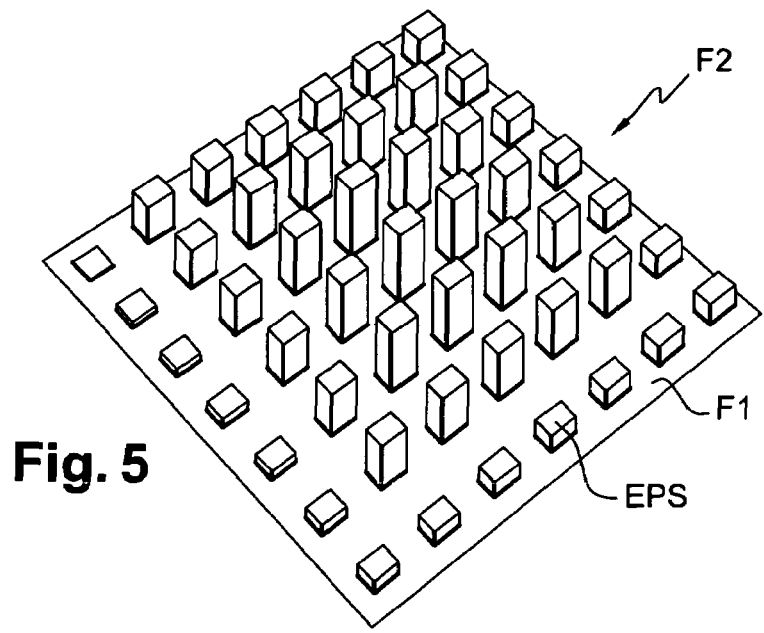
FIG. 5 is a diagrammatic perspective view of a plate having a face whose thickness increases in steps in accordance with a spiral.

In another embodiment using a matrix of photosensitive elements EPS, the thickness of the interferometer plate LC, LM varies continuously or stepwise, starting from the photosensitive element at one corner of the matrix, increasing in a spiral parallel to the edges of the matrix, and finishing at the central photosensitive element, as shown in FIG. 5. In that figure, the photosensitive elements EPS are shown separated in order to clarify the spiral profile of the face F2 of the interferometer plate, although in practice the photosensitive elements forming the steps of the spiral are in a continuous sequence. The plate then has a pyramidal shape, which has the advantage that the small increases in thickness are located at the edges of the matrix, where there are the highest thermal stresses between the silicon read circuit and the cadmium and zinc telluride (Cd Zn Te) substrate, for example. This configuration, which uses a total number of photosensitive elements EPS typically up to several tens of thousands over a matrix of 320.times.240 pixels, with a pitch of a few micrometers, is particularly well suited to high-resolution spectrometry (at a scale of less than 1 cm.sup.−1), an application that necessitates a large number of sampling points.

In another embodiment, the edge A of the dihedron is not perpendicular to each row of photosensitive elements EPS, which enables oversampling of interferograms and remedies aliasing. This technique is described in the paper "Simple infrared Fourier transform spectrometer adapted to low light level and high-speed", Philippe Voge and Jrme Primot, Optical Engineering, Vol. 37, No 9, September 1998, p. 2459-2466.

The stationary Fourier transform spectrometer of the invention has the following particular advantages:

extreme compactness, thanks to its fabrication on a substrate SU of the material of the interferometer plate LC, LM to form a single component (chip) integrating interferometer and photosensitive detector, which simplifies production;

considerable evolution potential for diverse configurations of use to suit different spectrometry and/or imaging applications, as explained later.

Cartographic spectral response measurements have been carried out with spectrometers of the invention having a matrix photodetector and a wedge-shaped interferometer plate. The plate LC had an oblique thinning angle .theta. of around 10 milliradians and no anti-reflection treatment of the second face F2. After processing, these measurements amount to illuminating the spectrometer SP with a quasi-plane and quasi-monochromatic wave of spectral width $d\lambda$ centered on a wavelength $\lambda$ varying from approximately 2 µm to 12 µm. Interferograms obtained at different wavelengths $\lambda$ show clearly the appearance of interference fringes that cover substantially all of the surface of the matrix of photosensitive elements EPS when the spectral width $d\lambda$ is low and that cover a portion of the matrix if the spectral width $d\lambda$ is increased. The contrast obtained in these interferograms enables interference fringes to be detected for different wavelengths from approximately 2 µm to 12 µm. The semi-reflecting treatment of the oblique face F2 of the plate LC helps to increase the contrast of the interference fringes.

There are described hereinafter three structures that use the spectrometer SP of any of FIGS. 3-5.

Figure 6A:
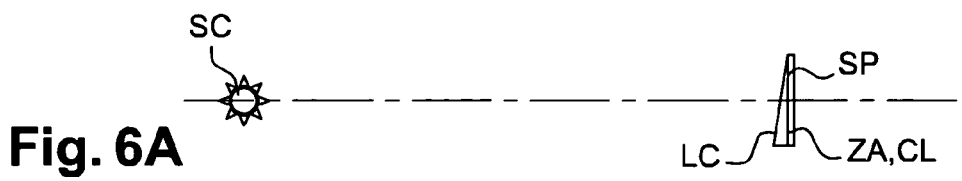
FIGS. 6A and 6B are diagrammatic illustrations of an application of microspectrometers of the invention to average-resolution or high-resolution spectrometry.

In a first configuration, the spectrometer SP is a microspectrometer for medium-resolution or high-resolution spectrometry. It is placed in or near a pupil plane, directly in front of a distant scene SC to be analyzed, as shown in FIG. 6A.

Figure 6B:
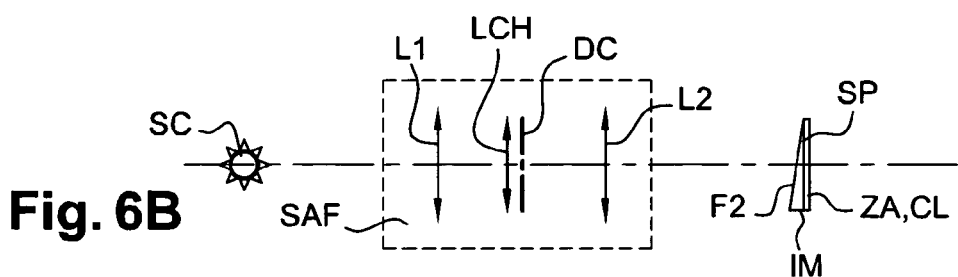

In another embodiment, the microspectrometer SP is positioned to the rear of an afocal system SAF clearly delimiting the field of view of the scene SC to be observed, as shown in FIG. 6B. The afocal system comprises two focusing lenses L1 and L2 and a field diaphragm DC between the lenses. The afocal system SAF optically conjugates the scene SC and the image plane IM on the active region ZA in the spectrometer SP. The afocal system also adapts the diameter of the light beam impinging on the entry lens L1 to the size of the face F2 of the spectrometer. Where applicable, a field lens LCH is placed in front of the field diaphragm DC to adjust the image of the scene on the image plane IM.

Figure 7:
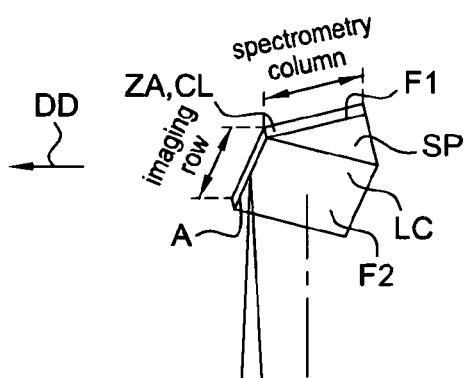
FIG. 7 is a diagram of a spectrometer of the invention to simultaneous spectrometry and imaging.

In a second configuration, the spectrometer SP receives the light beam from a distant scene, considered as a succession of linear field of view portions PSC, via a cylindrical lens LCY for simultaneous spectrometry and imaging, as shown in FIG. 7.

The edge A of the dihedron between the faces F1 and F2 of the interferometer plate LC is placed substantially parallel to the linear field of the view portions PSC. A row formed by a line of photosensitive elements EPS parallel to the edge A captures a field portion PSC of the scene to be observed that is imaged sequentially by scanning the matrix of photosensitive elements EPS of the detector in a direction DD perpendicular to the edge or by means of a scanning effect obtained, for example, from the movement of an aircraft with the spectrometer SP on board viewing a scene on the ground. Detection controlled perpendicularly to the edge A along rows formed by columns of photosensitive elements EPS allows spectrometric analysis of the light beam received from the scene to be observed.

Figure 8:
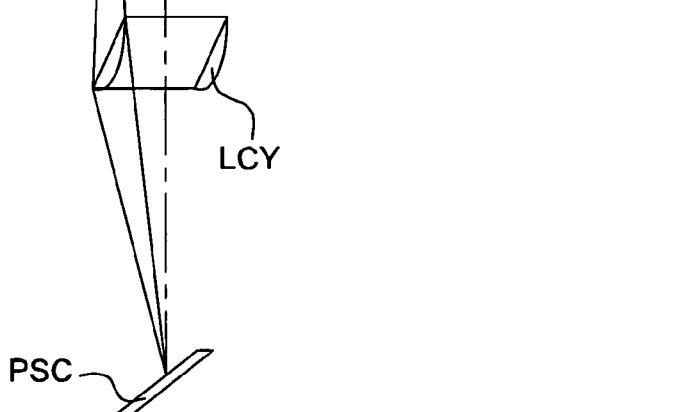
FIG. 8 is a diagram of a spectrometer of the invention to sequential spectrometry and imaging.
Figure 8:
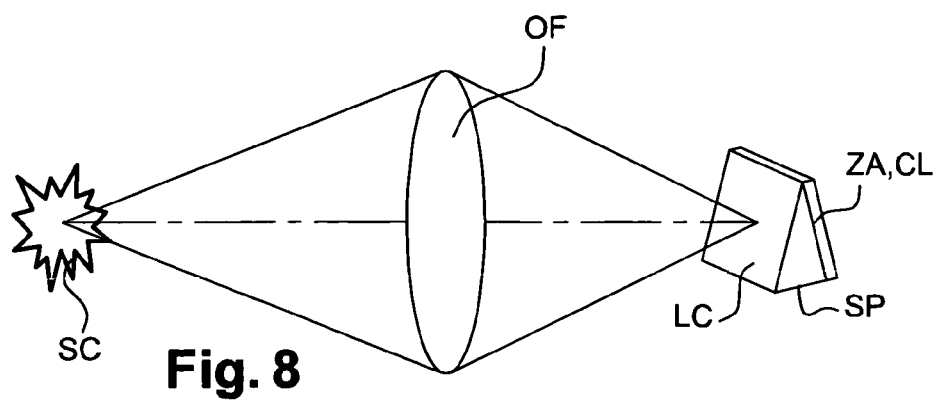

In a third configuration, shown in FIG. 8, the spectrometer SP is placed to the rear of a retractable focusing objective OF that is aimed sequentially at a distant scene SC, in order to provide a sequential function spectrometry and an imaging function. When the objective OF is transversely retracted from the field in front of the scene SC in the direction of the arrow F, the spectrometer SP has a direct view of the scene, as in FIG. 6A. When the objective OF is inserted into the field of view of the spectrometer SP, it operates in two-dimensional imaging mode.

We claim:

1. A stationary Fourier transform spectrometer comprising a substantially transparent substrate having a first face and a second face; semiconductor photosensitive elements having active faces coinciding with an image plane; said substrate being integrated against said photosensitive elements to form a single component, said first face of said substrate being planar and coinciding with the image plane on said photosensitive elements and forming with said photosensitive elements a substantially non-reflecting diopter, said second face of said substrate carrying a semi-reflecting diopter so as to form a two-wave stationary interferometer between said first face and second face, the thickness between said first face and second face of said substrate being substantially constant in front of each photosensitive element and varying regularly from one photosensitive element to another.

2. The spectrometer as claimed in claim 1, wherein the variation of said thickness between said first face and said second face of said substrate is such as to cause a linear optical path difference variation to be between a minimum value close to zero and a maximum value with a sampling step.

3. The spectrometer as claimed in claim 1, wherein said second face of said substrate is planar.

4. The spectrometer as claimed in claim 3, wherein said first face and said second face of said substrate are faces of a dihedral having an edge substantially perpendicular to parallel rows of photosensitive elements.

5. The spectrometer as claimed in claim 1, wherein said second face of said substrate includes steps having substantially the same width as at least one of the photosensitive elements.

6. The spectrometer as claimed in claim 5, wherein said second face of said substrate has a staircase profile.

7. The spectrometer as claimed in claim 5, wherein said second face of said substrate has a pyramidal shape.

8. The spectrometer as claimed in claim 1, wherein said semiconductor substrate is a crystalline compound.

9. A stationary Fourier transform spectrometer comprising a substantially transparent substrate having a first face and a second face; and semiconductor photosensitive elements having active faces coinciding with an image plane; said substrate being integrated against said photosensitive elements to form a single component, said first face of said substrate being planar coinciding with the image plane on said photosensitive elements and forming with said photosensitive elements a substantially non-reflecting layer, and said second face of said substrate carrying a semi-reflecting layer so as to form a two-wave stationary interferometer between said first face and second face, and the thickness between said first face and second face of said substrate being substantially constant in front of each photosensitive element and varying regularly from one photosensitive element to another.

10. The spectrometer as claimed in claim 9, wherein the variation of said thickness between said first face and said second face of said substrate is such as to cause a linear optical path difference variation to be between a minimum value close to zero and a maximum value with a sampling step.

11. The spectrometer as claimed in claim 9, wherein said second face of said substrate is planar.

12. The spectrometer as claimed in claim 11, wherein said first face and said second face of said substrate are faces of a dihedral having an edge between the first and second faces substantially perpendicular to parallel rows of photosensitive elements.

13. The spectrometer as claimed in claim 9, wherein said second face of said substrate includes steps having substantially the same width as at least one of the photosensitive element.

14. The spectrometer as claimed in claim 13, wherein said second face of said substrate has a staircase profile.

15. The spectrometer as claimed in claim 13, wherein said second face of said substrate has a pyramidal shape.

16. The spectrometer as claimed in claim 9, wherein said semiconductor substrate is a crystalline compound.

* * * * *